United States Patent [19]
Keller et al.

[11] Patent Number: 4,846,920
[45] Date of Patent: Jul. 11, 1989

[54] PLASMA AMPLIFIED PHOTOELECTRON PROCESS ENDPOINT DETECTION APPARATUS

[75] Inventors: John H. Keller, Poughkeepsie; Gary S. Selwyn; Jyothi Singh, both of Hopewell Junction, all of N.Y.

[73] Assignee: International Business Machine Corporation, Armonk, N.Y.

[21] Appl. No.: 130,573

[22] Filed: Dec. 9, 1987

[51] Int. Cl.⁴ .................... C23C 14/00; H01L 21/306; B44C 1/22; C23F 1/02
[52] U.S. Cl. ................................. 156/345; 156/643; 156/626; 156/627; 204/192.33; 204/298; 427/10; 427/34; 118/620; 118/665
[58] Field of Search .............. 204/298, 192.33, 192.32; 156/643, 646, 345, 626, 627; 118/665, 620; 427/10, 34

[56] References Cited

U.S. PATENT DOCUMENTS

| 4,579,623 | 4/1986 | Suzuki | 156/626 |
| 4,602,981 | 7/1986 | Chen | 156/627 |
| 4,615,761 | 10/1986 | Tada et al. | 156/345 X |
| 4,664,769 | 5/1987 | Cuomo | 204/192.1 |
| 4,675,072 | 6/1987 | Bennett et al. | 204/298 X |
| 4,687,930 | 8/1987 | Tamura | 250/309 |

FOREIGN PATENT DOCUMENTS 686529  5/1964  Canada .
0061036 4/1984  Japan .

OTHER PUBLICATIONS

IBM TDB vol. 20, No. 2 Jul. 1977, Geipel–End–Point Detection for Reactive Ion Etching.

Primary Examiner—David L. Lacey
Assistant Examiner—Thi Dang
Attorney, Agent, or Firm—William T. Ellis

[57] ABSTRACT

A plasma processing apparatus and process endpoint detection method including a plasma chamber for processing an item that has a first portion of a first material and a second portion of a second material, with the first and second materials having different work functions, and a structure for generating a plasma in the plasma chamber, with the plasma generating structure including at least a pair of RF-power electrodes with one of them being excited by an RF excitation frequency. The apparatus further includes a structure for generating and ejecting electrons from the second material only when the second material is exposed to the plasma, and a structure for increasing the energies of these generated electrons and accelerating these electrons into the etching plasma with sufficient energy to generate secondary electrons in the plasma. The apparatus further includes a structure for receiving a plasma discharge voltage signal, a structure for filtering the discharge electrical voltage signal to remove the RF excitation frequency and any DC components therein, and a structure for amplifying the natural frequencies of excitation and decay of the plasma discharge voltage perturbation signal, to thereby detect the processing endpoint.

In a preferred embodiment, the electron energy increasing and accelerating structure includes a structure for generating an electrode voltage sheath, and a structure for generating the electrons within this voltage sheath to thereby accelerate the electrons into the plasma. The electron generating structure includes a structure for directing a beam of photons in a selected energy range onto the item to be processed, which energy range is not sufficient to eject photoelectrons from the first material, but is high enough to generate photoelectrons from areas of exposed second material.

35 Claims, 2 Drawing Sheets

PLASMA AMPLIFIED PHOTOELECTRON PROCESS ENDPOINT DETECTION APPARATUS

BACKGROUND OF THE INVENTION

The present invention relates generally to the field of material processing, and more particularly to a plasma apparatus and a method for detecting a process endpoint.

It is desirable to have a non-intrusive, sensitive etch endpoint apparatus and method to detect the exposure of a desired sublayer in an item being etched. Several techniques have been demonstrated for etch endpoint detection, including optical emission spectroscopy, plasma impedance monitoring, and laser interferometry. However, all of these techniques fail to provide sufficient sensitivity when there is a very low pattern etch factor, i.e., a low percentage of the item's surface is exposed to the etching medium. Additionally, some of these techniques require considerable signal averaging to improve the signal-to-noise ratio. The use of these methods thus results in a slower response to etch plasma compositional changes and a slower response to endpoint indicia in the plasma.

The failure of the prior art techniques for detecting endpoint in the presence of very low pattern factors provide a significant impediment to the semiconductor industry drive for faster circuit devices. Such faster circuit devices require smaller component dimensions which often result in very low wafer pattern densities. At the same time, faster etch processes result in the need for more precise endpoint control with a fast endpoint detection response.

Alternatively, it is desirable to be able to detect with precision the coverage of a low pattern factor area in a deposition process. Similar detection problems to those noted above are encountered in this type of processing.

The invention as claimed is intended to remedy the above-described etch endpoint and deposition endpoint detection problems and limitations that arise when low pattern factors are present.

The advantages offered by the present invention are that extremely low pattern factor endpoints can be detected with high resolution and a very fast response. This endpoint detection can be utilized when etching, for example, a top layer through to another layer therebelow, when those two layers have different work functions. Likewise, this invention can be used when depositing a top layer on to another layer, where those two layers have different work functions. Accordingly, this invention can be used to detect endpoint when etching or depositing a top layer of metal, semiconductor, or insulator material through or on to another layer therebelow of metal, semiconductor or insulator material which layer has a different work function. This invention is particularly advantageous in that it is essentially independent of the plasma composition, it has a high detection signal-noise ratio, and it is not highly wavelength sensitive.

SUMMARY OF THE INVENTION

Briefly, one aspect of the invention comprises a plasma processing apparatus including
a plasma chamber for processing an item that includes a first portion of a first material and a second portion of a second material, with the first and second materials having different work functions;
means for generating a plasma in the plasma chamber, the plasma generating means including an RF-powered electrode excited by an RF excitation frequency;
means for generating and ejecting electrons only when the second material is exposed to the plasma;
means for increasing the energies of the generated electrons and accelerating the electrons into the plasma, with sufficient energy to thereby generate a secondary electrons in the plasma;
means for receiving a plasma RF discharge voltage signal;
means for filtering the plasma RF discharge voltage signal to remove the RF excitation frequency therefrom; and
means for amplifying the natural frequencies of the plasma discharge in response to the electron perturbation in the plasma discharge voltage signal to thereby detect the processing endpoint or a surface condition.

In a preferred embodiment, the electron energy increasing and accelerating means comprises means for generating an electrode voltage sheath, and means for generating the electrons within this voltage sheath to thereby accelerate the electrons into the plasma.

In a further aspect of this embodiment, the electron generating means may comprise means for directing a beam of photons in a selected energy range onto the item, which energy range is not sufficient to eject photoelectrons from the first material, but is high enough to generate photoelectrons from areas of exposed second material. This photon beam directing means may comprise means for generating laser pulses.

In a further embodiment of the present invention, the filtering means may comprise a capacitor for blocking out any DC signal components, and notch filter means for removing the harmonics of the RF excitation signal.

The present apparatus may further comprise means for integrating the filtered signal. In one embodiment, this integrating means may include means for detecting the filtered signal a predetermined time period after the occurrence of each laser pulse and integrating a plurality of the detected filtered signals.

In a further aspect of the present invention, a method is disclosed and claimed for detecting the endpoint in a plasma etching or deposition process. This method comprises the steps of
disposing an item to be processed in a plasma chamber, the item including a first portion of a first material and a second portion of a second material, with the first and second materials having different work functions;
generating by means of an RF electrode excited by an RF excitation frequency a plasma in the plasma chamber to process the item;
generating and ejecting electrons from the material only when the second material is exposed to the plasma;
accelerating the generated electrons into the plasma with a sufficient energy to thereby generate secondary electrons in the plasma;
receiving a plasma discharge voltage signal; and
filtering and amplifying the plasma discharge voltage signal to monitor the natural frequencies of excitation and decay of the discharge plasma, to thereby determine the process endpoint or surface condition.

DETAILED DESCRIPTION OF THE PREFERRED EMBODIMENT

The present invention is based on the use of the photoelectric effect, i.e., the fact that when an energy beam is directed at a material surface where the energy per quantum is greater than the work function for that material, then electrons will be ejected from that surface. It was recognized that in an etching process for etching, for example, a top layer of a first material through to a second layer therebelow of a second material, the work functions of those two materials will differ in almost every case. Likewise, in a deposition process, it was recognized that in the deposition of a top layer of a first material on to a second layer of a second material, the work functions of these two materials will differ in almost every case. The present invention utilizes the electron-ejection effect in combination with this realization of the differing work functions for these two layers of material on the item being processed to form an operable endpoint detection apparatus and method. Additionally, the invention resides in the use of means to increase the energy of electrons ejected when a given material is exposed and to accelerate those electrons into the plasma with sufficient energy to generate detectable secondary electrons. Finally, the present invention resides in the discovery that the response to these secondary electrons in the etching plasma may be detected at the natural frequencies of excitation and decay of the plasma discharge. Accordingly, the RF plasma excitation frequency and its harmonics, and the DC components in the excitation signal may be removed by appropriate filtering, while the band of frequencies containing the natural frequencies of excitation and decay of the plasma discharge is amplified to obtain a highly enhanced signal/noise ratio.

Figure 1:
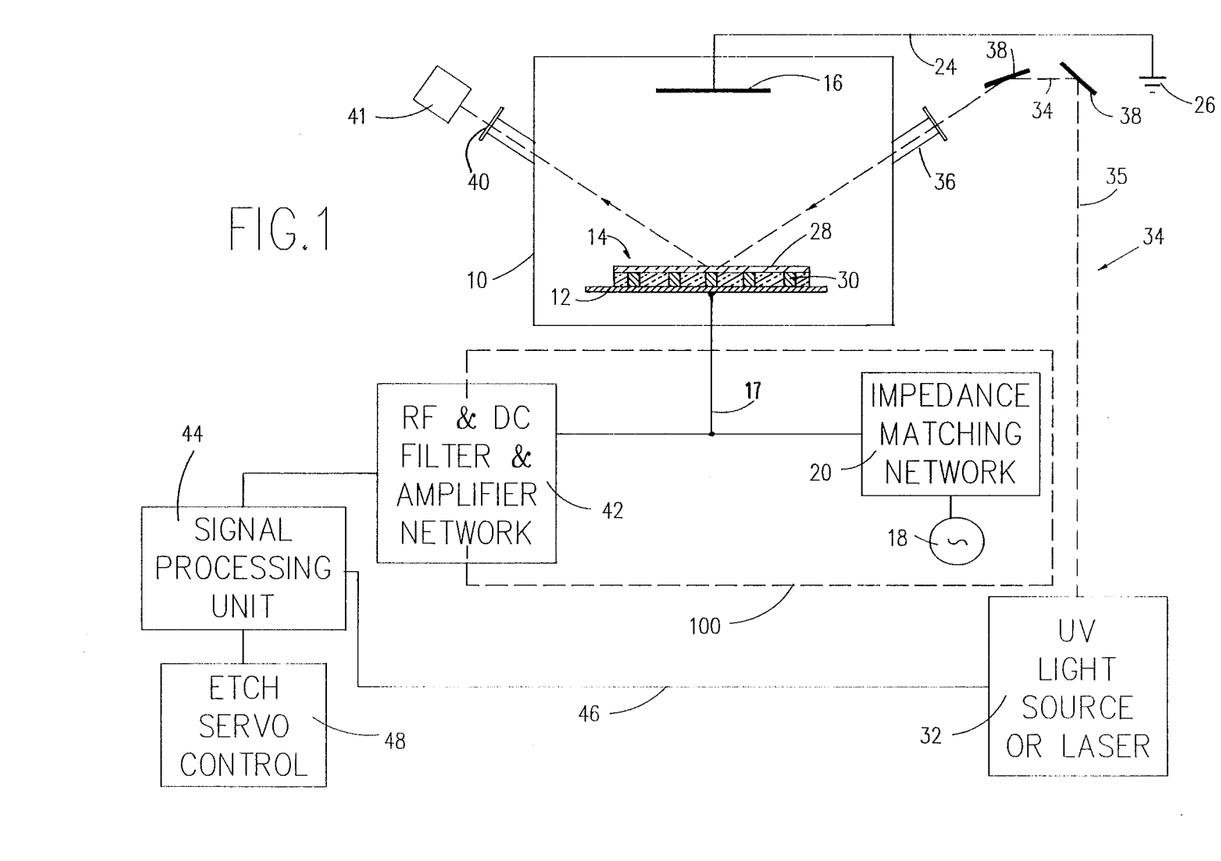
FIG. 1 is a schematic block diagram of one embodiment of the present invention.

The present invention will first be described in the context of an etching system. However, the invention applies equally to deposition and other processing systems. Referring now to FIG. 1, there is shown a standard dry etching chamber 10 with an electrode 12 upon which an item 14 to be etched is disposed. This item 14 being etched may comprise, by way of example, a top or a first layer 28 of a first material disposed over a second layer 30 of a second material, with the first and second materials having different work functions. (In FIG. 1, the second layer comprises the studs 30.) In the example shown in FIG. 1, this item to be etched may be a wafer 14. By way of example, and not by way of limitation, a typical dry etching chamber that may be utilized to perform reactive ion etching is described in the reference L. M. Ephrath, "Dry Etching for VLSI—A Review", in Semiconductor Silicon 1981, (eds. H. R. Huff, Y. Takeishi and R. J. Kriegler), The Electrochemical Society, Pennington, N.J., Vol. 81-5, pp. 627 (1981). Such a chamber would have gas inlets in order to provide an appropriate etching gas mixture for the chamber 10.

The RF electrode 12 in the chamber 10 is connected by means of an electrical line 17 to a standard RF source of energy 18. The RF energy source 18 provides an excitation frequency to excite the gases in the chamber to form an etching plasma therein. The RF excitation frequency from the RF excitation signal source 18 is provided to the electrode 12 by means of an impedance matching network 20. By way of example, and not by way of limitation, this impedance matching network 20 may be implemented by a standard LC or Pi circuit of the type shown in the reference A. J. Diefenderfer, Principles of Electronic Instrumentation, W. B. Saunders Co, Philadelphia, Pa. (1979). A second electrode 22 is disposed on the opposite side of the chamber from the electrode 12 and is connected by means of a line 24 to a reference potential 26. The RIE etching plasma is generated in the volume between the electrodes 12 and 22.

The invention further comprises means for generating and ejecting electrons only when a selected material is exposed to the etching plasma. In one embodiment, the means for generating electrons comprises means for directing a beam of energy of either photons or particles in a selected energy range onto the surface of the item 14 being etched. This energy range is not sufficient to eject electrons from one of the first material layer 28 or the second material layer 30 on the item 14 being etched, but is high enough to eject electrons from the other of the first material layer 28 or the second material layer 30, to thereby eject electrons when the other material is exposed.

In the embodiment shown in FIG. 1, the energy beam directing means comprises an energy beam source 32, an energy beam 34 following a path 35, and a window 36 into the chamber 10 to permit application of the energy beam onto the surface of the item 14 being etched. In this embodiment, the energy beam source may be comprised simply of a laser or a UV light source. An ultraviolet wavelength laser such as an excimer laser, or a frequency-quadrupled Nd:VAG laser, or a frequency-doubled tunable dye laser may also be utilized, for example. Conveniently, the energy beam source should be a pulsed source or a continuous wave source that is appropriately chopped. The energy beam path 32 may include one or more mirrors 38, as required, in order to direct the energy beam through the window 36 and into the chamber 10. This energy beam may be focussed or unfocused, depending on the amount of area that is to be impinged on the item 14 being etched. It may be desirable to also include a window 40 in the chamber 10 and an energy beam stop 41 to receive the energy beam after it is reflected off of the surface of the item 14 to prevent the beam from making uncontrolled reflections within the chamber 10. It should be noted that the energy beam may be directed normal to the item 14 being etched, or it may be directed at an oblique angle to the item 14 being etched. It should also be noted that the more oblique the angle of incidence of the energy beam onto the surface of the item 14, the more generalized will be the measurement for the endpoint.

In the example of FIG. 1, when the energy beam 34 strikes a metal, semiconductor, or insulator surface, it will eject photoelectrons if the photon energy exceeds the work function, U, of the material. The ejected photoelectrons will have an energy, $KE_e$, equal to: $KE_e = h\nu - U$, where $h\nu$ is the energy of the incident light. However, if the photon energy in the energy beam is less than the work function for the material, then no photoelectrons will be ejected, regardless of the intensity of the energy beam. Accordingly, the energy of the energy beam is chosen so that it does not eject electrons from one of the first or second materials on the item 14, but does eject electrons from the other of the first or second materials. By way of example, assume that the first layer 28 of first material comprises a layer of an insulator such as glass, polyimide, or silicon dioxide, while the second layer 30 of second material comprises a metal. The use of a laser which generates a UV light in the range of 230-250 nm results in a photon energy of between 5.4 to 4.9 eV, respectively. A typical metal work function is 4.3 to 4.5 eV, while a typical work function for an insulator such as silicon dioxide is on the order of 9-10 eV. Thus the direction of an ultraviolet energy beam to strike the first layer 28 of silicon dioxide will not eject photoelectrons. However, when small areas of metal become exposed during the etching process, these exposed metal areas will eject photoelectrons with an energy of between 0.6 to 0.8 eV, depending on the wavelength of the light and the exact value of the work function for the material. These photoelectrons thus are characterized by a low kinetic energy and insufficient energy to produce secondary ions by collisional processes.

However, the present invention further includes means for increasing the energies of these low kinetic energy photoelectrons and accelerating them with a sufficient energy into the etching plasma to generate secondary electrons in the plasma. In a preferred embodiment, this photoelectron energy increasing and accelerating means comprises means for generating an electrode voltage sheath, and means for generating these low kinetic energy photoelectrons within this voltage sheath to thereby accelerate the photoelectrons into the plasma. In the embodiment shown in FIG. 1, the photoelectron energy increasing and accelerating means is implemented by disposing the item 14 being etched on the RF cathode electrode 12 or the RF anode electrode 16 during the etching operation. The sheath voltage for these electrodes is determined by the input electrode power density and the gas composition and pressure in the etching chamber 10. For example, the RF cathode electrode 12 will typically generate a sheath voltage of 100 eV to 1 KeV either in a batch RIE tool using a 0.25 W/cm$^2$ electrode power density at a pressure of 50 mTorr, or in a single wafer etch tool using a 1-2W/cm$^2$ electrode power density and at a pressure of 0.5-4 Torr. The anode electrode 16 will typically have a sheath voltage of on the order of 30-500 volts for those excitation levels. Thus, in the example shown in FIG. 1 with the item 14 disposed on the cathode electrode 12, any low kinetic photoelectrons produced are ejected within the cathode sheath voltage disposed around the cathode electrode 12. Accordingly, these low kinetic energy ejected photoelectrons are accelerated by the strong potential field in the cathode sheath. The photoelectrons are accelerated across the sheath, gaining considerable kinetic energy from the electrostatic interaction of the electrons with the sheath field so that the photoelectrons are accelerated close to the sheath potential, which, as noted previously, ranges from 100 eV to 1 KeV. Accordingly, these low kinetic photoelectrons are converted to high energy electrons which are accelerated into the plasma between the electrodes 12 and 16. In the plasma, these high energy electrons have sufficient energy to induce secondary electrons from collisions with gas phase species. Additionally, these high energy photoelectrons can strike the opposite electrode 16 and produce secondary electrons from that surface. The net result of this generation of secondary electrons is the amplification of the photoelectron ejection phenomena.

If laser pulses are utilized as the energy beam source 32 to produce the primary photoelectrons, a repetitious perturbation of the plasma discharge impedance in the chamber results from the pulsed influx of high energy electrons following each laser shot (assuming an appropriate work function material has been exposed). This amplified repetitious perturbation of the plasma discharge impedance and voltage is caused by the sudden change in the current at the RF electrode as the high energy electrons are ejected into and amplified (by an increase in secondary ejections) by the plasma. Since the RF electrode 12 and the plasma are electrically coupled, this perturbation results in an oscillation which dampens out in time. It has been discovered that this amplified repetitious perturbation of the plasma discharge voltage may be monitored electronically with a high signal/noise ratio, by filtering out the RF excitation frequency (usually 13.56 MHz) along with any RF excitation frequency harmonics and DC components of the signal detected at the RF powered electrode 12, while amplifying the frequencies of excitation and decay of the plasma discharge perturbation.

In order to detect and measure this plasma perturbation, the RF electrode 12 may be connected to a filter and amplifier network 42 to remove unwanted frequencies and to amplify desired frequencies. In this regard, applicants have discovered that the major response from this plasma perturbation is in the natural frequencies of excitation and decay of the plasma discharge (the inverse of the decay time constant). Accordingly, a series of bandpass and blocking filters may be utilized to remove the RF fundamental excitation frequency, associated RF excitation frequency harmonics, and the DC self-biased voltage of the cathode 12. Note that in some applications, a set of LC networks may be combined with a low pass filter and a DC blocking capacitor in order to accomplish the desired filtering function. In other applications with high RF power, commercially available blocking networks may be required. Means are also provided for amplifying the natural frequencies of the excitation and decay of the plasma discharge in the plasma discharge voltage signal, i.e., amplifying the photoelectric signal by tuning the amplification response of the filter to match the excitation and decay frequencies.

After the removal of the undesirable DC and RF components from the electrode signal and the amplification of the natural frequencies of decay of the plasma discharge voltage perturbation, this filtered and amplified signal is applied to a signal processing unit 44. In one embodiment, this signal processing unit may simply comprise an oscilloscope. For a quantitative measurement, this signal processing unit 44 may comprise means for integrating the filtered and amplified signal in synchronization with the laser pulses from he energy beam source 32. This synchronization can be obtained by means of a synchronization signal via the line 46. In essence, the signal processing unit operates in accordance with the synchronization signal on line 46 to detect the filtered signal at a series of predetermined times after the occurrence of each laser pulse, and then to integrate these detected filtered signals over a plurality of laser pulses. A typical signal processing unit which may be utilized to integrate the signal comprises a boxcar integrator circuit. Such a boxcar integrator could be set, for example, to detect the filtered and amplified signal over a series of selected time-windows occurring at a series of different selected times after a given laser pulse, and then to integrate each of these different time-window signals over a series of laser pulses. A standard time-window period might be, for example, 1 microsecond and the number of laser shots that may be integrated might be in the range of 5–100. Alternatively, the signal processing unit 44 may be implemented by means of a transient digitizer. In essence, in this preferred embodiment the sudden appearance of 100 KHz to 3 MHz damped oscillations in phase with the laser shots at the output of the signal processing unit 44 indicates that the endpoint has been reached and/or signals the appearance of the low work function material.

The output from the signal processing unit 44 could be applied to an etch servo control unit 48 for controlling an etching parameter (RF power, gas flow) in the chamber 10, or for stopping the etching process when a predetermined signal level is detected by the signal processing unit 44. Some form of threshold detection unit might be included in the control block 48 to facilitate this operation. A similar servo control unit could be used to control a deposition parameter. Alternatively, the block 48 could simply comprise a chart recorder unit.

Figure 3:
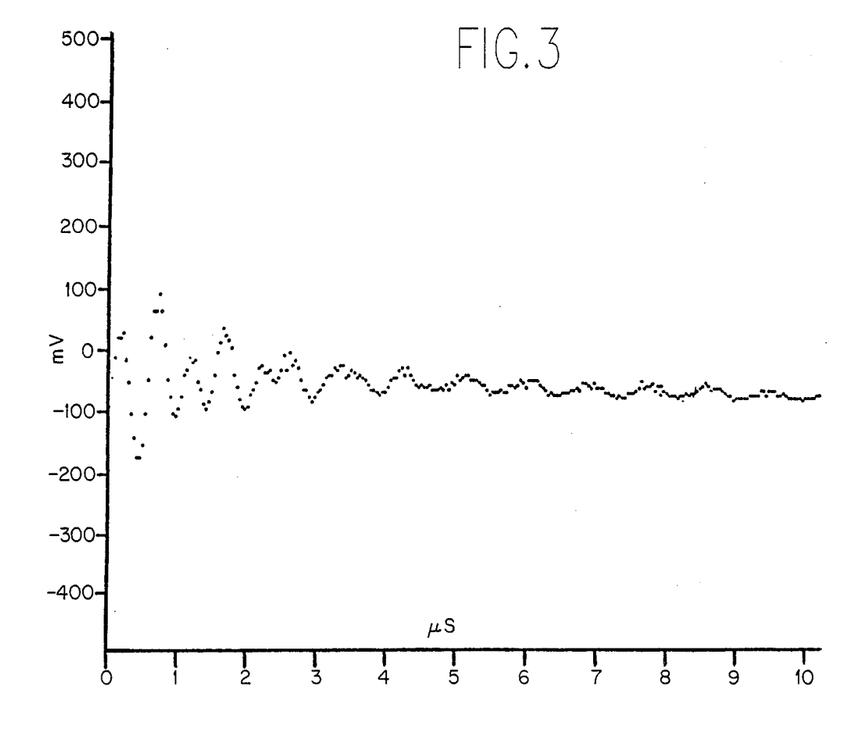
FIG. 3 is a graphical representation of an integrated signal response obtained by utilizing the apparatus and method of the present invention.

Referring now to FIG. 3, there is shown a typical integrated plasma perturbation response as seen at the output of the signal processing unit 44 when low kinetic energy photoelectron pulses have been amplified by an etching plasma. It can be seen that in this graph, the time axis is in microseconds and the voltage axis is in millivolts. The points in the graph represent a series of integrated time-windows occurring after a series of laser pulses. 40 laser shots were integrated in order to form each point in the time graph.

Figure 2:
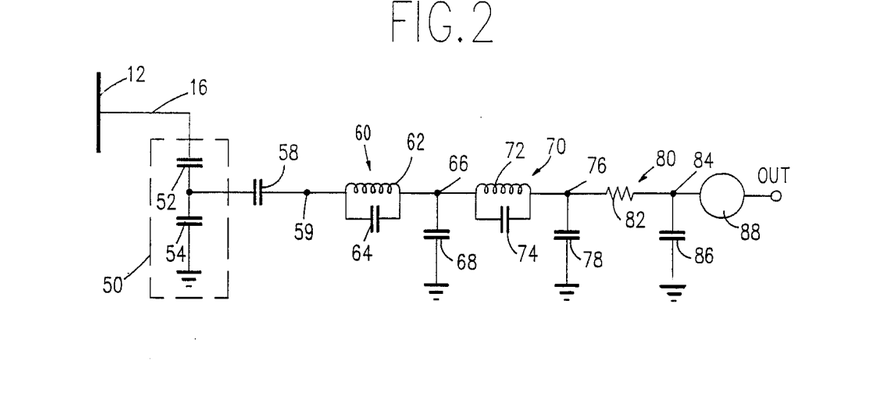
FIG. 2 is a schematic circuit diagram of a filter and amplifier network which may be utilized to implement the filter and amplifier block 42 of FIG. 1.

Referring now to FIG. 2, there is shown one example of a filter and amplifier network for removing various undesirable frequencies from the plasma discharge perturbation signal and for amplifying the frequencies of excitation and decay of the plasma discharge which may be utilized to implement the filter and amplifier network 40. In this embodiment, the electrode 12 is connected via line 16 to an optional capacitive divider network 50 for reducing the plasma discharge signal voltage to a desired voltage range. In the embodiment shown in FIG. 2, this divider network simply comprises the capacitors 52 and 54 connected in electrical series between the line 16 and a reference potential such as ground potential. A reduced voltage in the desired voltage range is taken from a node 56 disposed at the connecting point between the capacitors 52 and 54.

The circuit further includes means for blocking any DC components in the plasma discharge signal. This DC blocking function is accomplished in FIG. 2 simply by connecting a DC blocking capacitor 58 to the node 56 at one end thereof.

The circuit further includes means for removing the fundamental RF excitation signal from the plasma discharge impedance signal. In the embodiment shown in FIG. 2, this means is implemented simply by a notch filter 60 connected to the other end of the DC blocking capacitor 58 at node 59. The notch filter 60 comprises an inductor 62 connected in parallel to a capacitor 64, with the resulting notch filter designed to be in resonance with the RF drive frequency of approximately 13.56 MHz. In the embodiment of the present invention shown in FIGS. 1 and 2, the notch filter 60, the DC blocking capacitor 58, the capacitive voltage divider network 50, the impedance matching network 20, and the RF signal source 18 are all disposed within a ground shield 100. Because of the potential for high RF voltages at the notch filter 60, a wire wound inductor 62 is utilized in this filter.

The circuit further includes means for amplifying the range of frequencies including the frequencies of decay of the plasma discharge perturbation. A variety of different amplifiers may be utilized to perform this amplification function. In the embodiment shown in FIG. 2, this amplification function is accomplished by connecting node 66, at the other end of the notch filter 60, to the reference potential via a capacitor 68. For frequency components in the filtered plasma discharge signal which are below the resonance frequency for the notch filter 60, the notch filter acts as an inductor. Accordingly, the notch filter 60 in combination with the capacitor 68 is designed to be in resonance for a band of these lower, frequencies to thereby increase or peak the amplitude of the signal in this frequency range. By way of example, the notch filter 60-capacitor 68 combination could be designed to amplify signal frequencies in the range of 0.3–7 MHz, and preferably 1–5 MHz.

In the alternative, if the drive frequency is below the perturbation frequencies to be amplified, then inductor elements could be substituted for the capacitors 68 and 78 in FIG. 2 to effect signal amplification.

The circuit may further include a second lower-voltage notch filter 70 disposed outside of the ground shield 100 for removing any pick-up of the RF excitation frequency fundamental in the low RF environment. This notch filter is connected at one end to the node 66, and again may comprise a parallel-connected inductor 72 and capacitor 74 designed to be in resonance at approximately 13.56 MHz. Again, the node 76 at the other end of the second notch filter 70 may be connected to the reference voltage via a capacitor 78 to form a second amplifier. The inductive notch filter 70 in combination with capacitor 78 again is designed to be in resonance for a band of frequencies below the 13.56 MHz notch of the filter 70 to thereby increase or peak the amplitude of the signal in this frequency range.

The circuit further includes means 80 connected to node 76 for filtering out any harmonics of the RF excitation frequency fundamental. In the example embodiment shown in FIG. 2, the harmonic filtering means comprises a resistor 82 connected between node 76 and a node 84, and a capacitor 86 connected between the node 84 and the reference potential.

Finally, the circuit may include an optional fuse circuit 88.

Photoelectrons will be ejected from a given substrate material if the incident light energy exceeds the work function of the substrate material. Accordingly, a laser beam energy may be tailored to a wide variety of first and second materials on the item being etched. The only requirement is that the two materials have different work functions. Typical examples in which this process may be utilized comprise the etching of an insulator material such as glass, quartz, or polyimide with typically high work functions of on the order of 9–10 eV, with a second layer therebelow of a lower work function material such as a metal (with a work function in the range of 4.3–4.5 eV), or a semiconductor (with a work function in the range of 4.2). When an energy beam with a selected energy which is less than the work function for the insulator material, but greater than the work function energy for the material layer therebelow is incident on the insulators, then the energy beam will not eject photoelectrons at the outset of the etching process. However, when the energy beam is incident on exposed metal, (e.g., AlCu, Au, or W) or incident on a silicon surface, then photoelectrons will be ejected from the surface and accelerated by the sheath field to produce a plasma perturbation.

In the alternative, the low energy work function material may be disposed as the top layer over the second layer of a higher work function material. In this instance, a plasma perturbation signal would be received until the lower work function material has been etched away. This plasma perturbation would then significantly decrease and this change in the plasma perturbation could be monitored and used to determine endpoint.

Additionally, the present apparatus and technique is sensitive to silicon and may be used for the endpoint detection of heavily doped silicon regions over or under materials such a polysilicon. In this regard, N+ silicon disposed below polysilicon is generally very difficult to detect by other diagnostic techniques, especially where low pattern factors of the type found with advanced transistors are present. However, since the Fermi levels are much different between N+ silicon and polysilicon, the work functions for these materials also differ, with the work function of the N+ silicon being lower. Accordingly, the use of a frequency-doubled tunable dye laser may be used to emit photoelectrons from the N+ silicon but not from the polysilicon, thereby providing an endpoint detection facility.

As a further point, it has been determined that the present apparatus and method is highly sensitive to the surface composition f silicon during plasma etching. In particular, the present apparatus and technique can detect in-situ, during plasma processing, the presence of surface contaminants or extremely thin deposited layers disposed over silicon. Such layers form an effective barrier to photoelectron penetration, and thus result in a change in the observed photoelectric signal. Since other in situ techniques, such as laser interferometry, require much greater film thicknesses before detection is possible, the present apparatus and method offer considerable advantage in sensitivity for use in an in-situ surface analysis technique. Conventional surface monitoring techniques, such as X-ray photoelectron spectroscopy, or auger spectroscopy are highly surface sensitive, but the use of these techniques requires the transfer of the wafer to an ultra-high vacuum environment and so may only be employed for post-process analysis after the etching process is complete. Accordingly, the present apparatus and method is advantageous for the measurement and detection of surface contaminants or sputter deposited films during the actual plasma exposure period.

Note that the present structure can be used generally to detect the uniform deposition of a layer over an electron emitting layer. In this case, there would be an initial signal generated by the generation of secondary electrons in the plasma. This signal would disappear when a uniform layer was deposited over the electron emitting material.

The present etching apparatus has been discussed in the context of an item with a first layer of a first material disposed in a vertical relationship with a second layer of a second material. However, the invention is not limited for use in etching items with this configuration. In this regard, a first portion of a first material and a second portion of a second material may be disposed in different lateral locations on the item to be etched, and not directly over each other. This first and second material relationship could be used to determine endpoint.

The present invention is based on the appropriate tuning of the photoelectric effect to the work functions of the materials being etched to thereby generate low kinetic energy photoelectrons, in combination with an accelerating apparatus which will accelerate these low kinetic photoelectrons and convert them into high energy photoelectrons which will generate secondary electron emission in the plasma. In the present embodiment of the invention, the foregoing concepts are implemented by generating the photoelectrons within the sheath field for one of the RF electrodes. The sheath field amplifies the energy of the photoelectrons in an amount sufficient to induce secondary ionization in the plasma. It is this large number of secondary electrons combined with the primary photoelectrons which ultimately produces a detectable plasma perturbation. A further important aspect of the present invention is the recognition that the plasma perturbation signal primarily resides in the natural frequencies of excitation and decay of the plasma discharge (the inverse of the excitation and decay time constant of the perturbation). The present invention includes appropriate filtering and detecting apparatus in order to implement this aspect of the invention.

The present endpoint detection apparatus and method is direct, relatively low cost, and can be installed on existing equipment with minimal modifications. In this regard, only a single window port is required in the chamber in order to permit a laser beam to be directed onto the item being etched. Alternatively, an optical fiber or waveguide can be used in order to transmit the laser beam into the etching chamber. Detection of the resulting plasma perturbation may be accomplished simply by attaching electrical filters to the RF match box circuit and feeding the filtered output to an analog detector. It should be noted that a single laser can be utilized to provide power to operate multiple reactors, since only approximately one mJ/pulse is necessary (a typical excimer laser produces 100–1000 mJ/pulse). This technique can provide endpoint detection for future and existing process steps in which all other prior art techniques fail, and thus may play a critical role in future semiconductor technology processing.

The present technique and apparatus was successfully demonstrated on low pattern factor product wafers comprising a first layer of an insulating material disposed over Al/Cu vias. The signal/noise ratio of the measured optogalvanic signal was determined to be greater than 20:1, indicating a very high sensitivity. In this demonstration, the semiconductor wafer being etched had a 5% via hole pattern, with the balance being $SiO_2$. No measurable photoelectric signal was derived from the blanket $SiO_2$ wafers.

It should be noted that the present apparatus and method is not highly wavelength sensitive as compared to other techniques, such as, for example, laser-induced fluorescence. Accordingly, a chopped incoherent UV light source may be used in place of the laser. Examples of other alternative light sources include mercury arc lamps, and hydrogen or Xenon discharge lamps.

Additionally, it should be noted that the present apparatus and technique is only weakly dependent on the composition of the plasma, and so has an extremely broad base, or window, of operation.

While the present invention has been particularly shown and described with reference to preferred embodiments therefore, it will be understood by those skilled in the art that the foregoing and other changes inform and detail may be made therein without departing from the scope and the spirit of the present invention.

We claim:

1. A plasma processing apparatus comprising:
   a plasma generation chamber for processing an item that includes a first portion of a first material and a second portion of a second material, with said first and second materials having different work functions;
   means for generating a plasma in said plasma generation chamber and a plasma RF discharge voltage signal which has natural frequencies of excitation and decay as well as an RF excitation frequency, said plasma generating means including an RF-powered electrode, said plasma for exposing an amount of second material or for covering an amount of any exposed second material,
   means for directing a beam of energy in a selected energy range of impinge onto said item, which energy range is not sufficient to eject electrons from said first material, but is high enough to generate electrons from any exposed areas of second material;
   means for increasing the energies of said generated electrons and accelerating said generated electrons into said plasma with sufficient energy to thereby generate secondary electrons in said plasma;
   means for receiving said plasma RF discharge voltage signal;
   means for filtering said plasma RF discharge voltage signal to remove said RF excitation frequency therefrom; and
   means connected to said filtering means for receiving said filtered RF discharge voltage signal and for amplifying the natural frequencies of excitation and decay in the filtered plasma discharge voltage signal in the plasma discharge to thereby detect the process endpoint or surface condition.

2. An apparatus as defined in claim 1, wherein said electron energy increasing and accelerating means comprises
   means for generating an electrode voltage sheath; and
   means for generating said generated electrons within said voltage sheath to thereby accelerate said generated electrons into said plasma.

3. An apparatus as defined in claim 2, wherein said electron generating means comprises means for directing a beam of photons in a selected energy range on to said item, which energy range is not sufficient to eject electrons from said first material, but is high enough to generate electrons from areas of exposed second material.

4. An apparatus as defined in claim 3, wherein said beam directing means comprises a laser.

5. An apparatus as defined in claim 3, wherein said beam directing means comprises a pulsed laser.

6. An apparatus as defined in claim 2, further comprising means for integrating said filtered and amplified signal.

7. An apparatus as defined in claim 6, further comprising:
   means connected to said integrating means for generating a control signal to control a process parameter in said plasma chamber in response to said integrated signal.

8. An apparatus as defined in claim 1, wherein said filtering means comprises
   a capacitor; and
   notch filter means for removing any RF excitation signal harmonics from said discharge voltage signal.

9. An apparatus as defined in claim 8, wherein said amplifying means includes means for amplifying said filtered signal in the frequency range of 0.3-7 MHz.

10. An apparatus as defined in claim 1, wherein said plasma generation chamber is a dry etching chamber; and wherein said plasma generating means comprises means for generating an etching plasma.

11. An apparatus as defined in claim 1, wherein said plasma generation chamber is a deposition chamber; and wherein said plasma generating means comprises means for generating a deposition plasma.

12. A plasma etching apparatus comprising:
    a dry etching chamber for etching a wafer, said wafer including a top layer of a first material and a second layer of a second material, with said first and second materials having different work functions;
    means for generating an etching plasma in said etching chamber to etch said wafer, said means including at least a pair of electrodes, with at least one of said at least a pair of electrodes being excited by an RF excitation frequency, with at least one of said at least a pair of electrodes receiving a discharge voltage signal from said plasma, which discharge voltage signal has natural frequencies of excitation and decay as well as said RF excitation frequency, so that said etching plasma etches said first material to thereby expose at least a portion of said second material;
    means for directing a beam of photons in a selected energy range onto said wafer, which energy range is not sufficient to eject photoelectrons form one of said first or second materials on the wafer, but is high enough to eject photoelectrons from the other of the first or second materials, to thereby change the number of photoelectrons ejected when said other material is exposed;
    means for generating a sheath field adjacent to one of said at least a pair of electrodes to accelerate said ejected photoelectrons into said etching plasma with sufficient energy to thereby generate secondary electrons;
    means for filtering the discharge voltage signal at one of said at least a pair of electrodes to remove the RF excitation frequency therefrom; and
    means for amplifying the natural frequencies of excitation and decay of the plasma discharge for detecting the etching endpoint.

13. An apparatus as defined in claim 12, wherein said beam directing means includes means for generating laser pulses.

14. An apparatus as defined in claim 13, wherein said filtering means comprises
    a capacitor; and notch filter means for removing an RF excitation signal harmonics.

15. An apparatus as defined in claim 14, wherein said amplifying means includes means for amplifying said filtered signal in a frequency range of 0.3–7 MHz.

16. An apparatus as defined in claim 15, further comprising means for integrating said filtered signal.

17. An apparatus as defined in claim 16, wherein said integrating means includes means for detecting said filtered signal a predetermined time period after the occurrence of each laser pulse and integrating a plurality of said detected filtered signals.

18. An apparatus as defined in claim 16, further comprising means connected to said integrating means for generating a control signal to control an etch parameter in said dry etch chamber in response to said integrated signal.

19. A method for detecting the endpoint in a plasma process comprising the steps of:
  disposing an item to be processed in a plasma chamber, said item including a first portion of a first material and a second portion of a second material, with said first material having a greater work function than said second material;
  generating by means of an RF electrode excited by an RF excitation frequency a plasma in said plasma chamber to process said item to change the amount of second material which is exposed, with the plasma having a plasma discharge voltage signal thereacross having natural frequencies of excitation and decay as well as said RF excitation frequency;
  directing a beam of photons in a selected energy range to impinge onto said item, which energy range is not sufficient to eject electrons from said first material, but is high enough to eject electrons from areas of exposed second material;
  accelerating said generated electrons into said plasma with a sufficient energy to thereby generate secondary electrons in said plasma;
  receiving said plasma discharge voltage signal;
  filtering and amplifying the plasma discharge voltage signal so that the natural frequencies of excitation and decay of the plasma are detectable; and
  detecting any perturbations in said filtered and amplified plasma discharge voltage signal that indicate the appearance or disappearance of said second material to thereby determine the process endpoint.

20. A method as defined in claim 19, wherein said accelerating step comprises the steps of
  generating a voltage sheath adjacent to said RF electrode; and
  generating and ejecting said generated electrons within said voltage sheath to thereby accelerate said generated electrons.

21. A method as defined in claim 20, wherein said filtering and amplifying step includes the steps of filtering out said RF excitation frequency from said plasma discharge voltage signal and amplifying a band of frequencies containing the natural frequencies of excitation and decay of the plasma discharge.

22. A method as defined in claim 21, wherein said amplifying step comprises the step of amplifying a band of frequencies in the range 0.3–7 MHz.

23. A method as defined in claim 19, wherein said detecting step comprises the step of electrically integrating said filtered signal.

24. A method as defined in claim 23, wherein said integrating step comprises the step of:
  detecting said filtered signal in a time interval occurring a predetermined time period after the occurrence of each photon pulse, and integrating a plurality of said detected filtered signals.

25. A method as defined in claim 23, further comprising the step of generating a control signal to control a process parameter in said plasma chamber in response to said integrated signal.

26. A method as defined in claim 19 wherein said beam directing step comprises the step of directing a pulsed photon beam at said item to be processed.

27. A method as defined in claim 19, wherein said disposing step comprises the step of disposing said item in a dry etching chamber; and wherein said plasma generating step comprises the step of generating an etching plasma.

28. A method as defined in claim 19, wherein said disposing step comprises the step of disposing said item in a deposition chamber; and wherein said plasma generating step comprises the step of generating a deposition plasma.

29. A method for detecting the endpoint in a plasma etching process comprising the steps of:
  disposing an item to be etched in a dry etching chamber, said item including a top layer of a first material disposed over a second layer of a second material, with said first and second materials having different work functions;
  generating by means of an RF excitation frequency an etching plasma in said etching chamber to etch said item to change the amount of second material which is exposed, said etching plasma having a discharge voltage signal thereacross having natural frequencies of excitation and decay as well as said RF excitation frequency;
  directing a beam of energy in a selected energy range onto said item, which energy range is not sufficient to eject photoelectrons from one of said first or second materials on said item, but is high enough to eject photoelectrons into said plasma from the other of said first or second materials;
  ejecting photoelectrons by means of said beam of energy when said other material is exposed by said etching process;
  accelerating said ejected photoelectrons into said plasma with a sufficient energy to thereby generate secondary electrons in said plasma;
  receiving said plasma discharge voltage signal;
  filtering said plasma discharge voltage signal to remove said RF excitation frequency;
  amplifying the natural frequencies of excitation and decay of the filtered plasma voltage discharge signal; and
  detecting any perturbations in the amplified natural frequencies of excitation and decay in this voltage signal that indicate the appearance or disappearance of second material to thereby detect the etch endpoint.

30. A method as defined in claim 29,
  wherein said filtering step comprises the step of filtering out any RF excitation frequency harmonics and any D.C. components from said plasma discharge voltage signal.

31. A method as defined in claim 30, wherein said beam directing step includes the step of directing laser pulses at said item to be etched.

32. A method as defined in claim 31, wherein said detecting step includes the step of electrically integrating said filtered signal.

33. A method as defined in claim 32, wherein said integrating step comprises the step of detecting said filtered signal in a time-interval occurring a predetermined time period after the occurrence of each laser pulse and integrating a plurality of said detected filtered signals.

34. A method as defined in claim 29, further comprising the step of generating a control signal to control an etch parameter in said dry etching chamber in response to said integrated signal.

35. A method as defined in claim 29, wherein said amplifying step comprises the step of amplifying a band of frequencies in the range 0.3–7 MHz.

* * * * *